(12) United States Patent
Lai et al.

(10) Patent No.: US 8,288,815 B2
(45) Date of Patent: Oct. 16, 2012

(54) GATE STRUCTURE OF SEMICONDUCTOR DEVICE HAVING A CONDUCTIVE STRUCTURE WITH A MIDDLE PORTION AND TWO SPACER PORTIONS

(75) Inventors: Erh-Kun Lai, Taichung County (TW);
Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 150 days.

(21) Appl. No.: 12/333,359

(22) Filed: Dec. 12, 2008

(65) Prior Publication Data
US 2010/0148239 A1 Jun. 17, 2010

(51) Int. Cl.
*H01L 29/792* (2006.01)
(52) U.S. Cl. .................. 257/324; 257/E29.309
(58) Field of Classification Search .................. 257/324, 257/E29.309
See application file for complete search history.

(56) References Cited

U.S. PATENT DOCUMENTS

| 5,476,801 | A * | 12/1995 | Keshtbod ........ 438/264 |
| 7,345,336 | B2 * | 3/2008 | Jeon et al. ........ 257/324 |
| 7,514,744 | B2 * | 4/2009 | Buh et al. ........ 257/344 |
| 2007/0126067 | A1 | 6/2007 | Hattendorf et al. |
| 2009/0096013 | A1 * | 4/2009 | He et al. ........ 257/324 |

FOREIGN PATENT DOCUMENTS

| CN | 1134196 | 10/1996 |
| WO | WO 95/09423 | 4/1995 |

OTHER PUBLICATIONS

Chinese language office action dated Apr. 28, 2012.
English language translation of abstract of CN 1134196 (published Oct. 23, 1996).

* cited by examiner

*Primary Examiner* — Howard Weiss
(74) *Attorney, Agent, or Firm* — Thomas|Kayden (57) ABSTRACT

A gate structure for a semiconductor device is provided. The gate structure includes a conductive structure. The conductive structure insulatively disposed over a substrate includes a middle portion and two spacer portions. The middle portion has a first surface and two second surfaces. The first surface is between the two second surfaces. The two spacer portions are respectively connected to the two second surfaces of the middle portion. A width of each of the two spacer portions gradually increases from top to bottom.

17 Claims, 11 Drawing Sheets

GATE STRUCTURE OF SEMICONDUCTOR DEVICE HAVING A CONDUCTIVE STRUCTURE WITH A MIDDLE PORTION AND TWO SPACER PORTIONS

BACKGROUND OF THE INVENTION

1. Field of the Invention

The invention relates in general to a gate structure of a semiconductor device and methods of forming a word line structure and a memory, and more particularly to a gate structure of a semiconductor device and methods of forming a word line structure and a memory capable of increasing a current of a memory cell.

2. Description of the Related Art

In order to satisfy the requirement in the reduction of size of a semiconductor element, the integration of the semiconductor element may be increased. However, increasing the integration to reduce the size of a memory tends to be limited due to the array structure of the memory.

Figure 1:
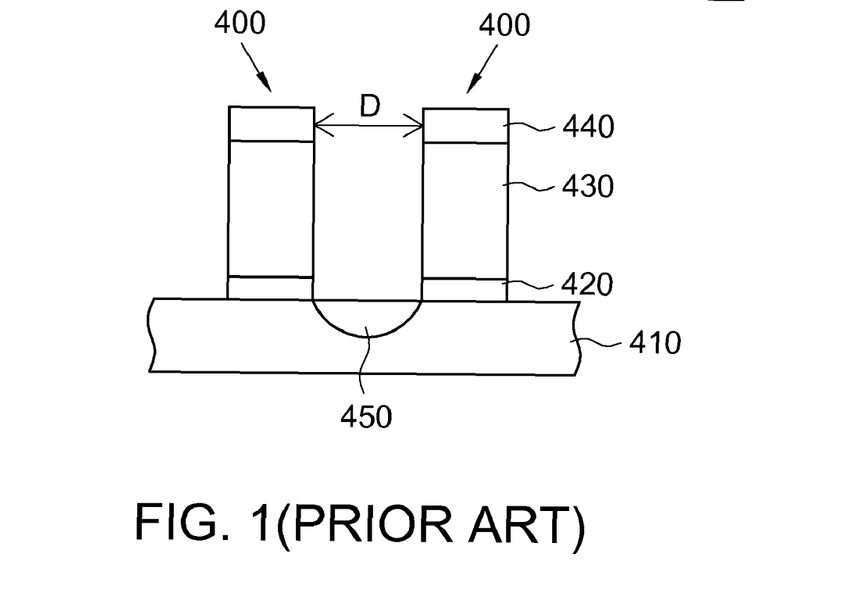
FIG. 1 (Prior Art) is a schematic illustration showing a conventional NAND array memory.

In a NAND array memory, for example, a dopant is implanted between upper and lower adjacent memory cells to form a doped region, so that the doped region is served as a drain or a source. FIG. 1 (Prior Art) is a schematic illustration showing a conventional NAND array memory. As shown in FIG. 1, the NAND array memory 40 has word lines 400, each of which includes a dielectric layer 420, a conductive layer 430 and a mask layer 440 sequentially disposed on a substrate 410. The position where a dopant 450 is implanted is between the adjacent word lines 400. If an interval D between the adjacent word lines 400 is reduced in order to increase the integration of the memory 40, the dopant 450 may not be implanted due to the limitation of the apparatus.

Furthermore, when the integration of the memory is increased, the memory generally tends to encounter the condition of the short channel effect (SCE) and the condition that the current of the memory cell is insufficient. Thus, it is an important subject for the related industries to provide a memory capable of satisfying the requirement in the size and the integration while increasing the current of the memory cell.

SUMMARY OF THE INVENTION

The invention is directed to a gate structure of a semiconductor device and methods of forming a word line structure and a memory, wherein the gate structure of the semiconductor hereinafter can be referred as the word line structure of the memory. A width of a conductive structure of the word line structure can be increased to increase a current of a memory cell so that the speed of reading/writing the memory can be increased. Furthermore, as for a NAND array memory using the word line structure of the invention, an interval between the adjacent word line structures is reduced as a result of the increased width of the conductive structure. An inversion area is formed between the adjacent word line structures to serve as a medium for conducting the word line structures. Therefore, it is unnecessary to preserve a space for implanting the dopant between the adjacent word line structures so that the integration of the memory can be enhanced.

According to a first aspect of the present invention, a gate structure for a semiconductor is provided. The gate structure comprises a conductive structure. The conductive structure insulatively disposed over a substrate comprises a middle portion and two spacers. The middle portion has a first surface and two second surfaces. The first surface is between the two second surfaces. The two spacer portions are respectively connected to the two second surfaces of the middle portion. A width of each of the two spacer portions gradually increases from top to bottom.

According to a second aspect of the present invention, a method of forming a memory is provided. The method comprises: (a) forming a first dielectric layer, a conductive layer and a first mask layer on a substrate, wherein the first mask layer has two first openings for exposing a portion of the conductive layer; (b) etching the conductive layer according to a pattern of the first mask layer so as to form two first grooves at the portion of the conductive layer, wherein a bottom surface and side surfaces of each of the two first grooves expose the conductive layer, and an interval between the side surfaces of each of the two first grooves is greater than a width of each of the two first openings; (c) covering a conformal layer over the first mask layer and the two first grooves positioned on the conductive layer, wherein the conformal layer filled into each of the two first grooves has a void; and (d) anisotropically etching the conformal layer, and etching the conductive layer and the first dielectric layer along the voids in the two first grooves until the substrate and the first mask layer are exposed so that a word line structure is formed.

According to a third aspect of the present invention, a method of forming a word line structure is provided. The method comprises: (a) forming a conductive layer and a first mask layer on a substrate, wherein the first mask layer has an opening for exposing a portion of the conductive layer; (b) etching the conductive layer according to a pattern of the first mask layer so as to form a groove at the portion of the conductive layer, wherein a bottom surface and side surfaces of the groove expose the conductive layer, and an interval between the side surfaces of the groove is greater than a width of the opening; (c) covering a conformal layer over the first mask layer and the groove positioned on the conductive layer, wherein the conformal layer filled into the groove has a void; and (d) anisotropically etching the conformal layer, and etching the conductive layer along the void in the groove until the substrate and the first mask layer are exposed.

According to a fourth aspect of the present invention, a semiconductor is provided. The semiconductor comprises a substrate, a dielectric layer and a plurality of gate structures. The dielectric layer is formed on the substrate. Each of the gate structures comprises a conductive structure. The conductive structure is disposed over the dielectric layer. The conductive structure comprises a middle portion and two spacer portions. The middle portion has a first surface and two second surfaces. The first surface is between the two second surfaces. The two spacer portions are respectively connected to the two second surfaces of the middle portion, and a width of each of the two spacer portions gradually increases from top to bottom.

The invention will become apparent from the following detailed description of the preferred but non-limiting embodiments. The following description is made with reference to the accompanying drawings.

DETAILED DESCRIPTION OF THE INVENTION

The invention mainly provides a gate structure of a semiconductor device and methods of forming a word line structure and a memory. The gate structure is used for a semiconductor. The gate structure includes a conductive structure. The conductive structure is insulatively disposed over a substrate. The conductive structure includes a middle portion and two spacer portions. The middle portion has a first surface and two second surfaces. The first surface is between the two second surfaces. Two spacer portions are respectively connected to the two second surfaces of the middle portion. The width of each spacer portion gradually increases from top to bottom.

Several embodiments will be described in detail in the following with reference to several embodiments and the accompanying drawings to illustrate the invention. It is illustrated in the following embodiments that the semiconductor is a memory and the gate structure of the semiconductor is a word line structure of the memory. However, a person having ordinary skills in the art understands that these drawings and texts are for the illustrative purposes without limiting the scope of the invention.

First Embodiment

FIGS. 2A to 2D are schematic illustrations showing a method of forming a word line structure according to a first embodiment of the invention. The word line structure of this embodiment can be formed in a memory. The method of forming the word line structure includes the following steps.

Figure 2A:
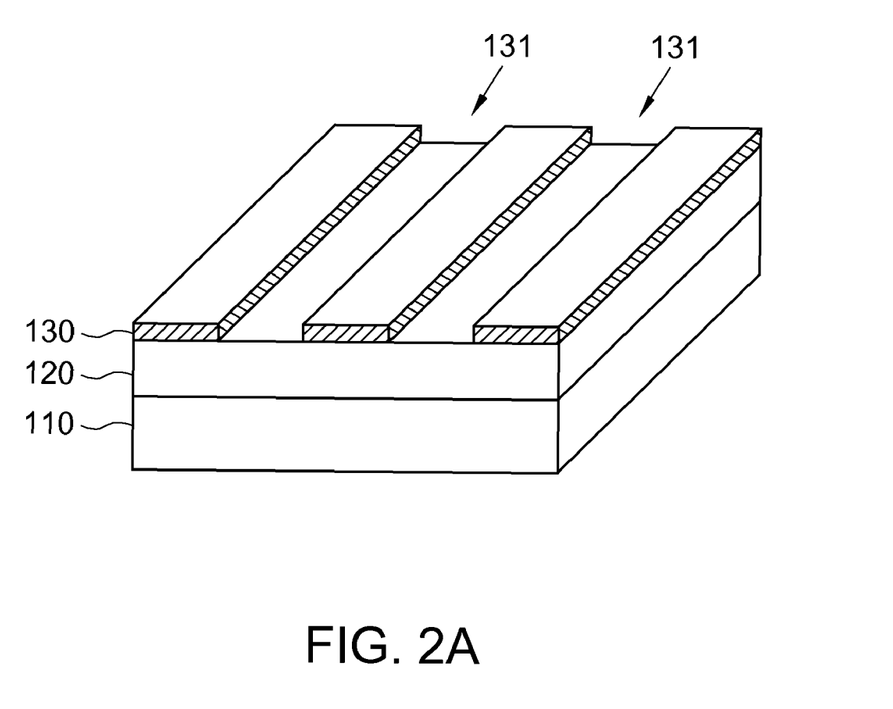
FIGS. 2A to 2D are schematic illustrations showing a method of forming a word line structure according to a first embodiment of the invention.

First, as shown in FIG. 2A, a conductive layer 120 and a mask layer 130 are sequentially formed on a substrate 110. The mask layer 130 has openings 131 for exposing a portion of the conductive layer 120. The conductive layer 120 is composed of, for example, polysilicon, and the mask layer 130 is composed oft for example, oxide or silicon nitride.

Figure 2B:
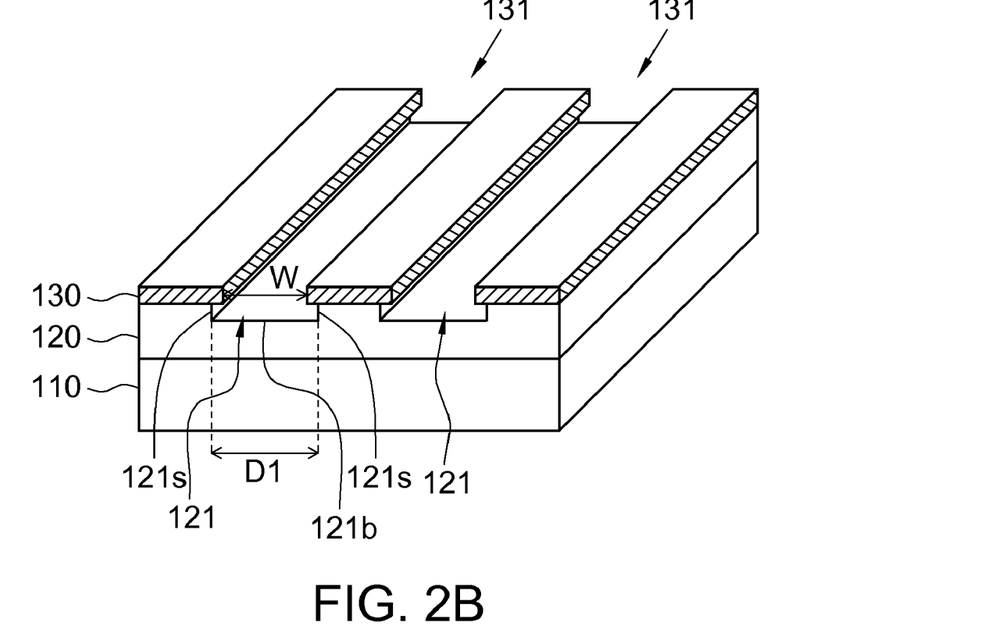
Figure 3:
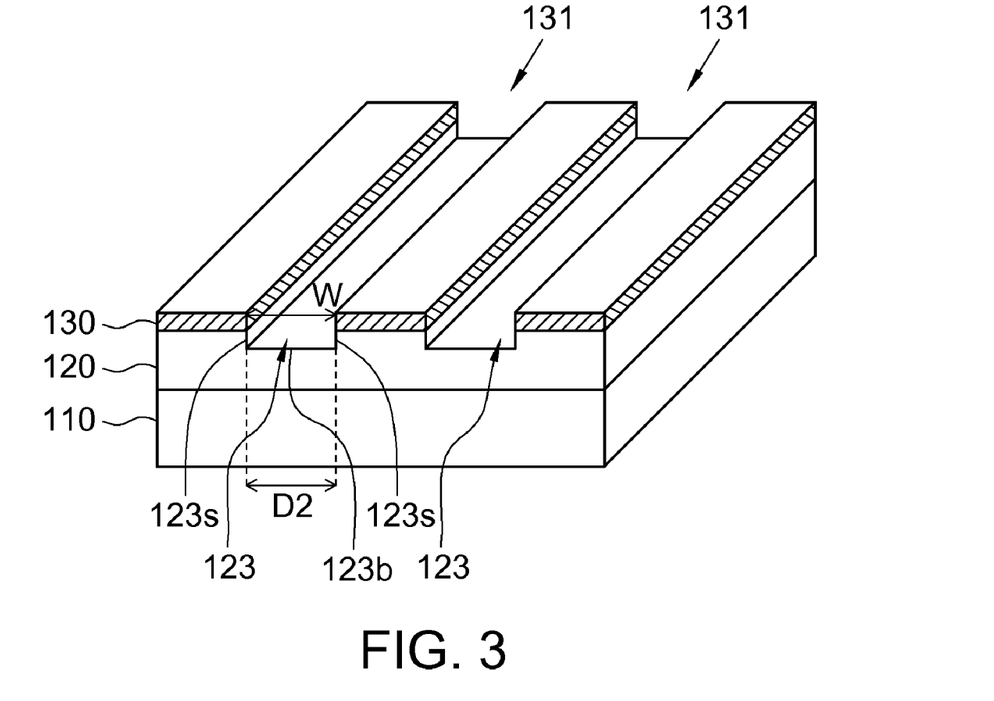
FIG. 3 is a schematic illustration showing notches formed at the conductive layer.

Next, the conductive layer 120 is etched according to a pattern of the mask layer 130 so as to form grooves 121 at the portion of the conductive layer 120, as shown in FIG. 2B. A bottom surface 121b and side surfaces 121s of each of the grooves 121 expose the conductive layer 120, and an interval D1 between the side surfaces 121s of each groove 121 is greater than a width W of each of the openings 131. In this embodiment, the structure of FIG. 2B is, for example, formed by two sub-steps. First, an anisotropic etching process is performed by way of dry etching or wet etching using a 2,2',6,6'-tetramethyl4,4'-methylenedianiline (TMMA) solution so that notches 123 are formed at the portion of the conductive layer 120, as shown in FIG. 3. A bottom surface 123b and side surfaces 123s of each notch 123 expose the conductive layer 120, and an interval D2 between the side surfaces 123s of each notch 123 is substantially equal to the width W of each opening 131. That is, the sub-step of anisotropic etching only partially etches the conductive layer 120 in a downward direction and does not completely penetrate through the conductive layer 120. Thus, the substrate 110 is not exposed. Next, an isotropic etching process is performed to etch the side surfaces 123s and the bottom surfaces 123b of the notches 123 so that the grooves 121 shown in FIG. 2B are formed. Of course, a person having ordinary skills in the art may easily understand that the method of forming the structure in FIG. 2B may also be applied to this embodiment.

Figure 2C:
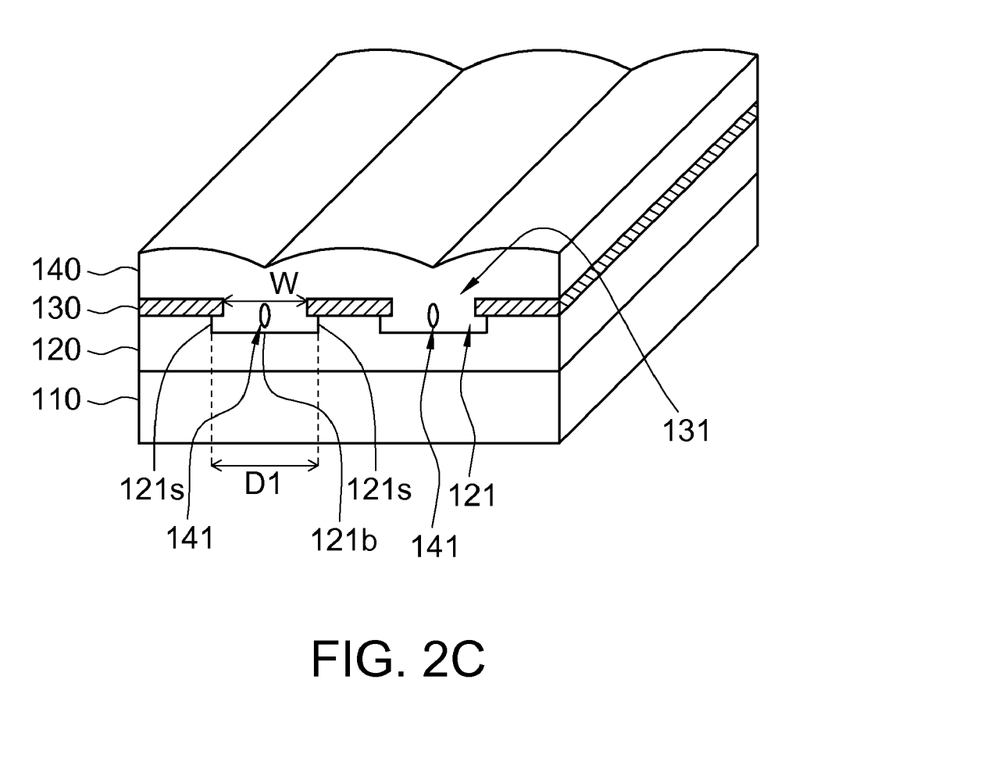

Then, as shown in FIG. 2C, a conformal layer 140 with substantially the same thickness covers over the mask layer 130 and the grooves 121 positioned on the conductive layer 120. The conformal layer 140 filled into each groove 121 has a void 141. That is, as the interval D1 between the side surfaces 121s of each groove 121 is greater than the width W of each opening 131, when the conformal layer 140 is covered via each opening 131, each opening 131 is filled with the conformal layer 140 with the equal thickness before the grooves 121 are fully filled. Thus, the void 141 is formed in the conformal layer 140 of each groove 121. The conformal layer 140 is preferably composed of a furnace polysilicon conductive material, and the polarity of the conformal layer 140 can be doped to have the same polarity as the conductive layer 120 by way of implanting.

Figure 2D:
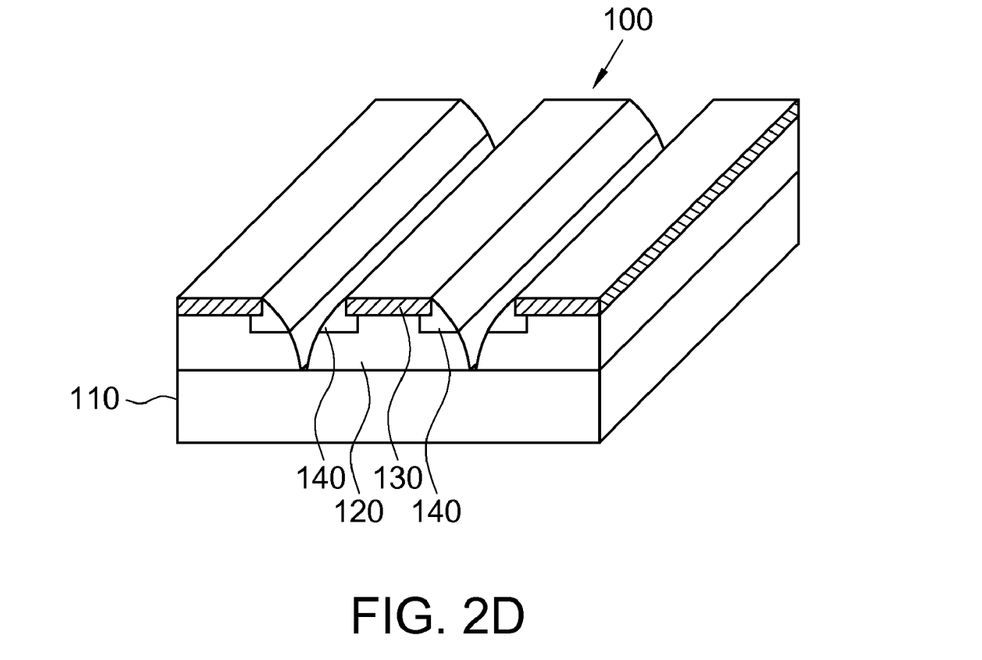

Next, the conformal layer 140 is anisotropically etched by way of reactive ion etching (RIE), and the conductive layer 120 is etched along the voids 141 in the grooves 121 until the substrate 110 and the mask layer 130 are exposed so that a word line structure 100 is formed, as shown in FIG. 2D.

Figure 2E:
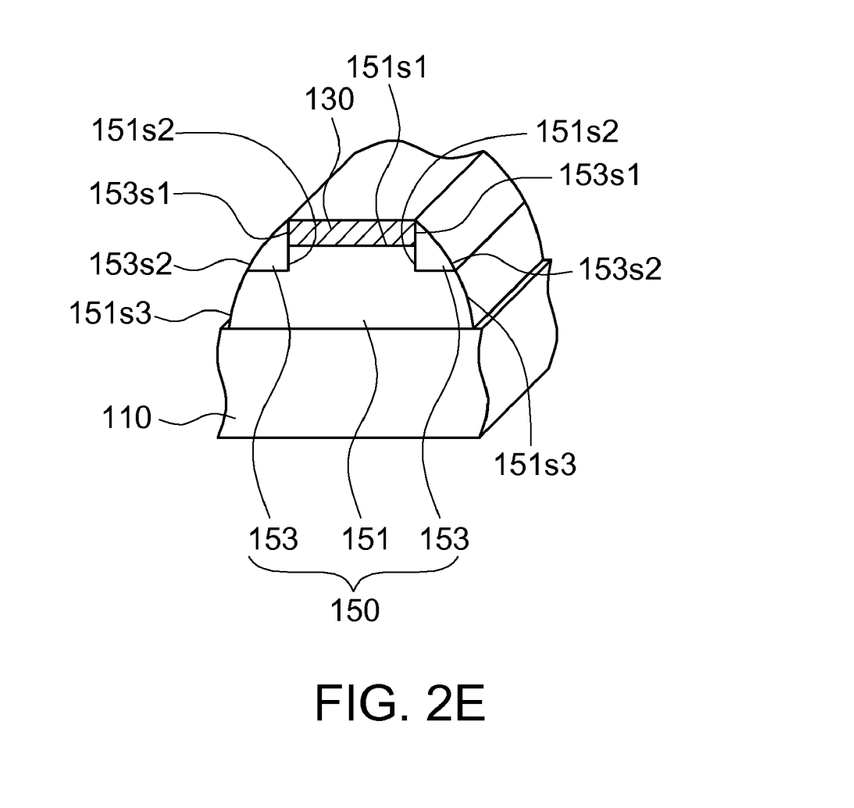
FIG. 2E is another schematic illustration showing the word line structure in FIG. 2D.

The structural features of the word line structure 100 (see FIG. 2D) formed according to the method of forming the same will be described in the following. The word line structure 100 includes the mask layer 130, the remained conductive layer 120 and the remained conformal layer 140. The remained conformal layer 140 is formed on two sides of the remained conductive layer 120 so that the width of the word line structure 100 gradually increases from top to bottom. The word line structure 100 may be regarded as including a conductive structure 150 (i.e., the remained conductive layer 120 and the remained conformal layer 140) and the mask layer 130, as shown in FIG. 2E. The conductive structure 150 may be, for example, insulatively disposed on the substrate 110 by the disposition of an insulating layer (e.g., 160 in FIG. 5B). The conductive structure 150 includes a middle portion 151 and two spacer portions 153. The middle portion 151 has a first surface 151s1 and two second surfaces 151s2. The first surface 151s1 is between the two second surfaces 151s2. The two spacer portions 153 are respectively connected to the two second surfaces 151s2 of the middle portion 151. As the etching capability of anisotropic etching in the longitudinal direction is greater than that in the transversal direction, the widths of the spacer portions 153 gradually increase from top to bottom after the etching step. An inner surface 153s1 of each spacer portion 153 contacts with each second surface 151s2 of the middle portion 151, and an outer surface 153s2 of each spacer portion 153 opposite the inner surface 153s1 is a curved surface. More specifically speaking, each outer surface 151s3 of the middle portion 151 extending from the outer surface 153s2 of each spacer portion 153 is a curved surface as well. That is, the maximum width of the conductive structure 150 is the width of the bottom surface of the conductive structure 150. The mask layer 130 is disposed on the middle portion 151 of the conductive structure 150, and the two sides of the mask layer 130 are respectively enclosed by the two spacer portions 153 of the conductive structure 150 so that the mask layer 130 is embedded into the conductive structure 150.

The word line structure 100 of this embodiment may be applied to various memories, such as an NAND array memory, a PACAND array memory or a virtual ground array memory. In the following, several embodiments will be described to illustrate various memories using the word line structure 100 of this embodiment and methods of forming the same. Generally speaking, the shape of the conductive structure of the conventional word line structure is often like the shape of the conductive layer 430 shown in FIG. 1. Comparing with the prior art, the width of the conductive structure 150 of this embodiment is equal to a sum of the width of the middle portion 151 and the widths of the two spacer portions 153. Thus, the memory cell having the word line structure 100 of this embodiment may have the higher current to increase the speed of reading/writing the memory.

Second Embodiment

Figure 4:
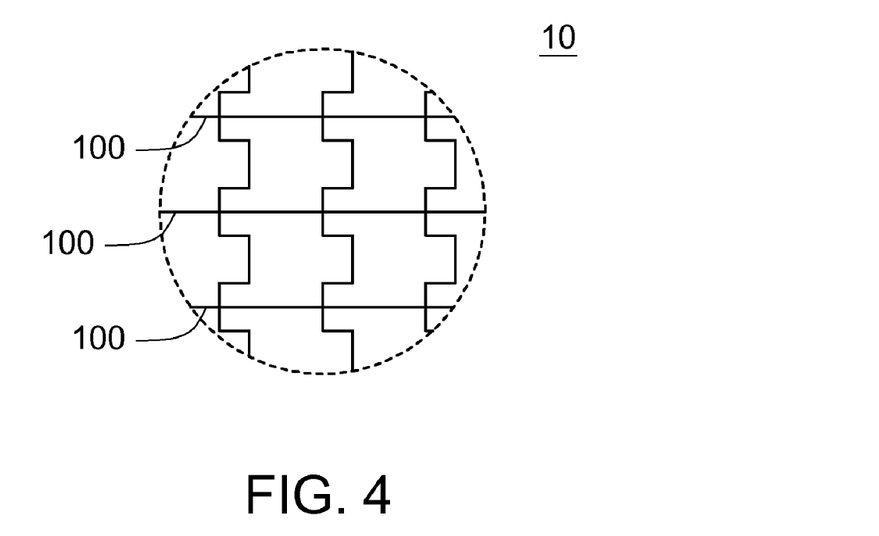
FIG. 4 is a schematic illustration showing a NAND array memory according to a second embodiment of the invention.

In this embodiment, the word line structure 100 of the first embodiment is formed in an NAND array memory 10 in FIG. 4. The same components will refer to the same numbers and the detailed descriptions thereof will be omitted. The method of forming the NAND array memory 10 includes the following steps.

Figure 5A:
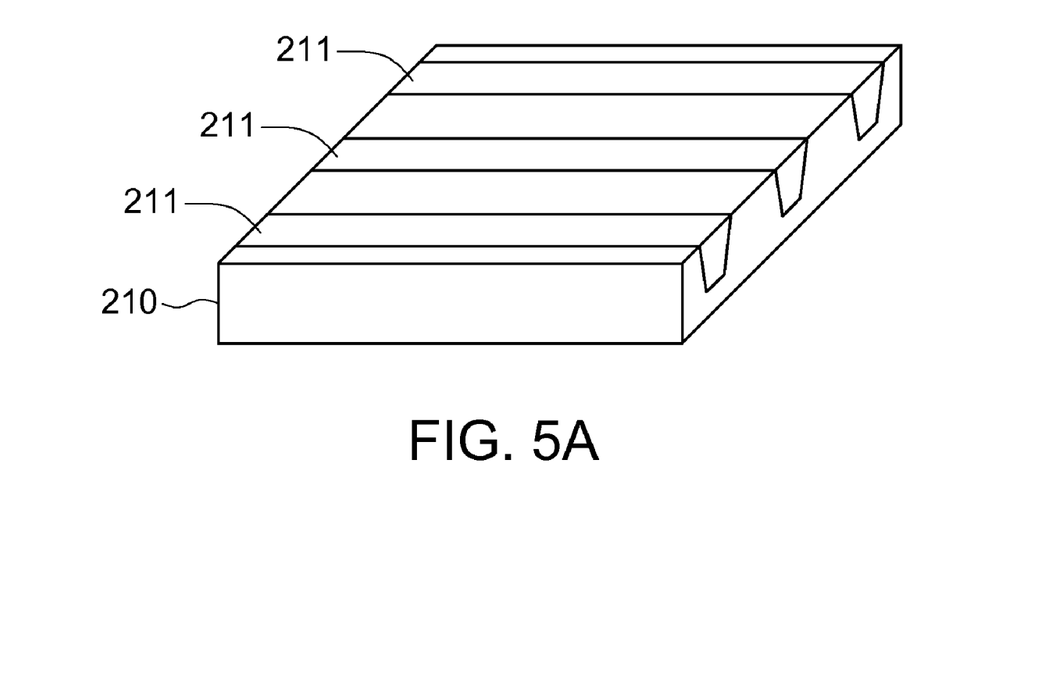
FIGS. 5A to 5C are schematic illustrations showing a method of forming the NAND array memory according to the second embodiment of the invention.

First, as shown in FIG. 5A, a substrate 210 is provided. The substrate 210 may be a bulk substrate, a TFT substrate or a silicon on insulator (SOI) substrate. The substrate 210 has shallow trench isolation (STI) structures 211 for providing the insulation.

Figure 5B:
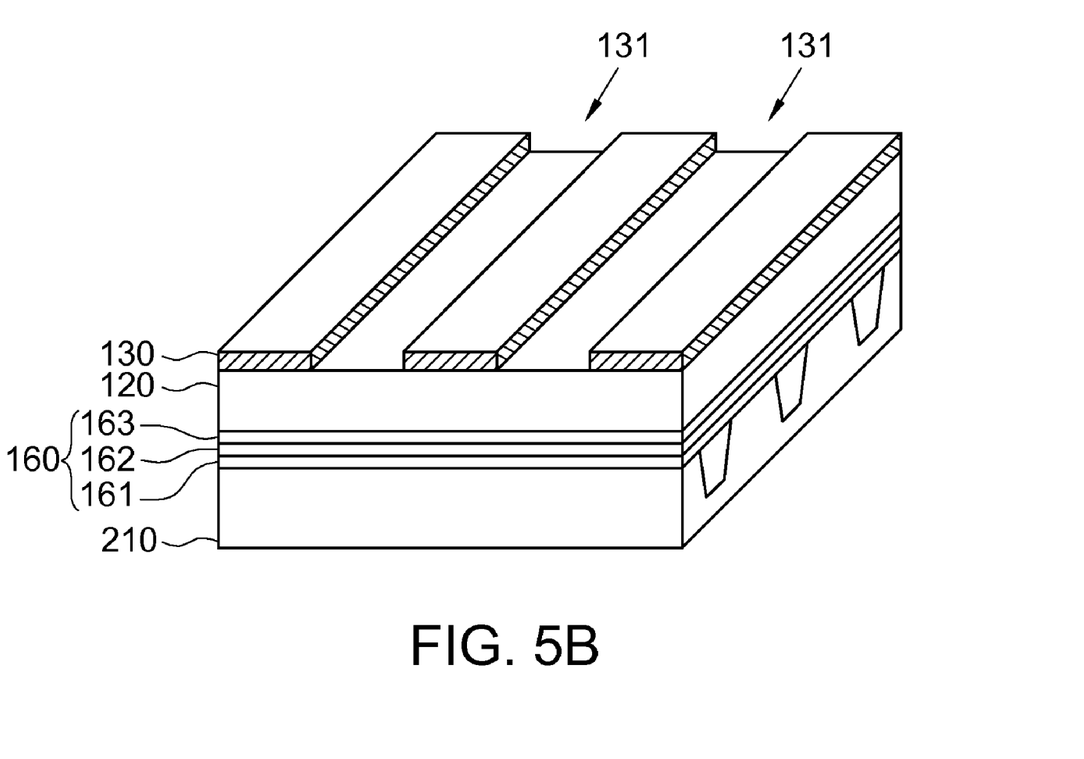

Next, as shown in FIG. 5B, a tunneling layer 161, a charge trapping layer 162 and a blocking layer 163 of a dielectric layer 160, the conductive layer 120 and the mask layer 130 are sequentially formed on the substrate 210. The mask layer 130 has the openings 131 for exposing the portion of the conductive layer 120. The tunneling layer 161, the charge trapping layer 162 and the blocking layer 163 are respectively composed of oxide (represented by O), nitride (represented by N) and oxide so that an ONO stacking structure is formed. The tunneling layer 161 lets the charge tunneling pass, the charge trapping layer 162 stores the charges, and the blocking layer 163 blocks the charges from passing. Of course, the stacking structure of the dielectric layer 160 is not limited thereto, and the dielectric layer 160 may also have the Bandgap Engineered SONOS (BE-SONOS), ONON, OSONO or ONOSO stacking structure, wherein S represents the silicide.

Figure 5C:
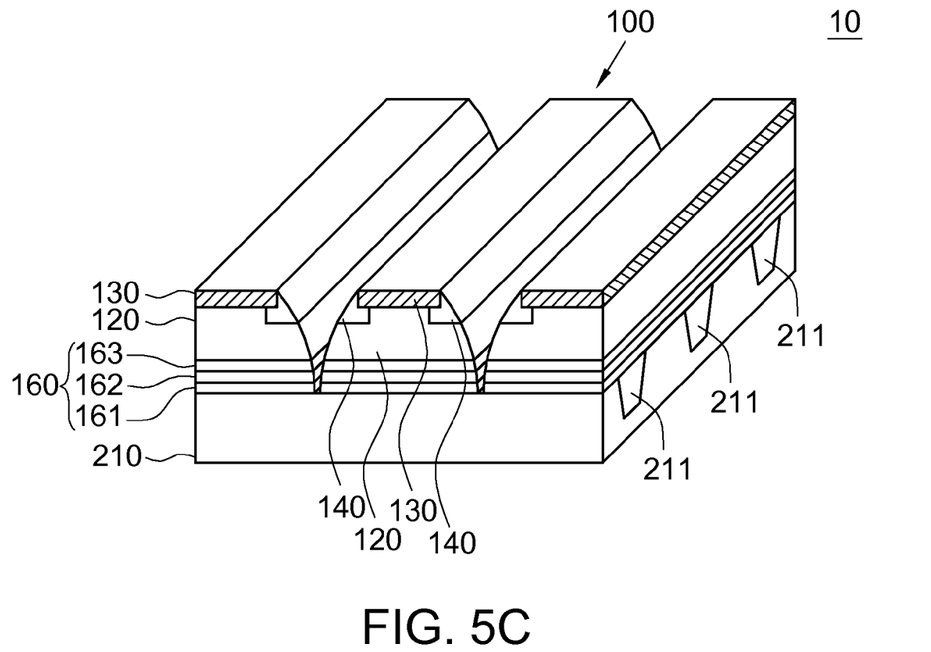
Figure 5D:
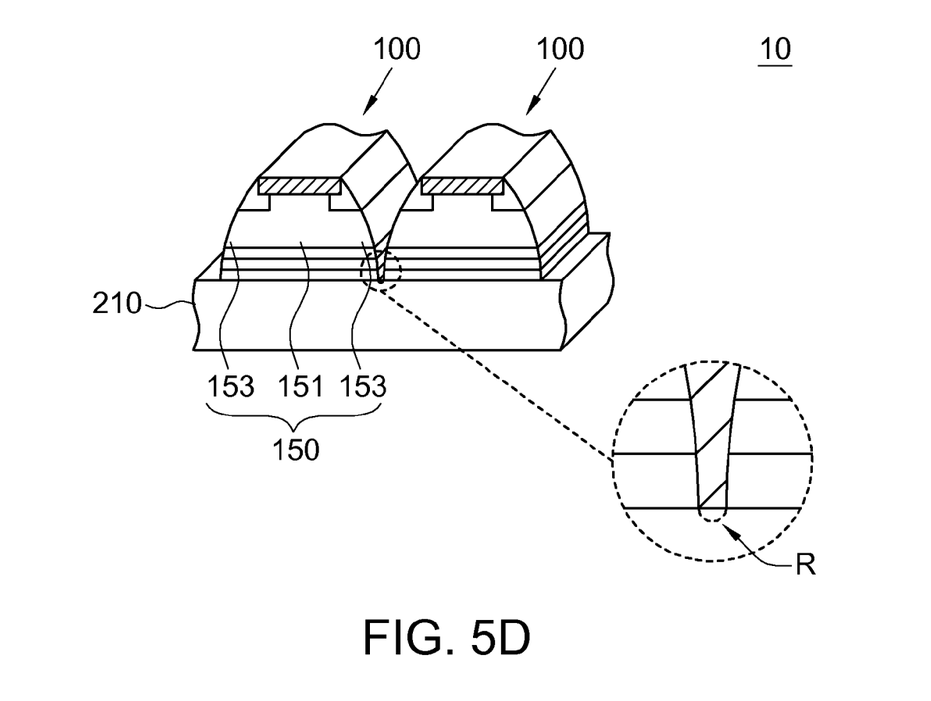
FIG. 5D is another schematic illustration showing the word line structure in FIG. 5C.

Then, the steps corresponding to FIGS. 2B to 2D are performed so that the NAND array memory 10 shown in FIGS. 5C and 5D is formed. Compared with the two word line structures respectively with the conductive layer 430 having the shape shown in FIG. 1, each of the adjacent word line structures 100 in FIG. 5D has the two spacer portions 153 and the middle portion 151 to be a conductive structure, so the interval between the adjacent word line structures 100 may be reduced to be smaller than 30 nm. When a voltage is applied to the word line structures 100, the conductive structures 150 induce an inversion area R between the two word line structures 100 according to the fringe field effect so that several inverted source/drain regions are formed in the substrate 210. In other words, it is unnecessary to form the doped region in the substrate to serve as the source/drain in the NAND array memory 10. Thus, the size of the NAND array memory 10 may be further reduced without preserving the space for implanting a dopant, while the condition of the short channel effect (SCE) may also be effectively avoided. In addition, the width of the conductive structure 150 of the NAND array memory 10 is greater than that of the conventional conductive structure, which only has a part of the middle portion 151 of the present embodiment. Therefore, the speed of reading/writing the NAND array memory 10 may be correspondingly increased.

Third Embodiment

Figure 6:
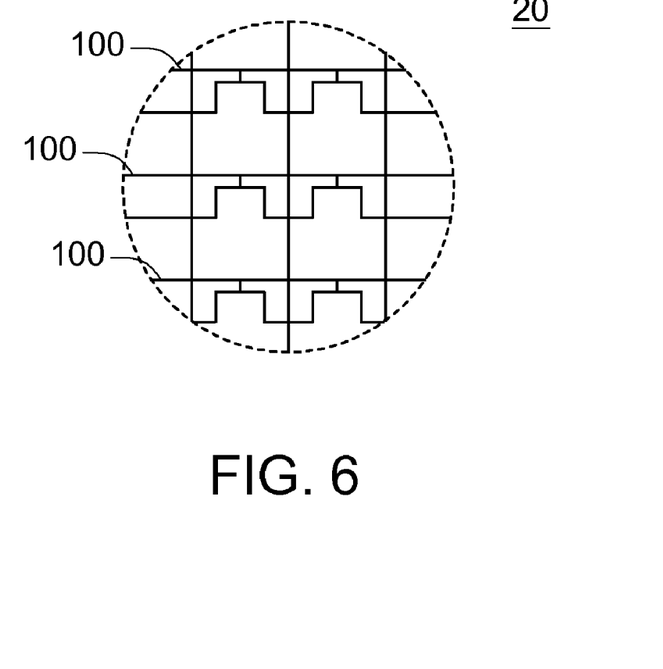
FIG. 6 is a schematic illustration showing a virtual ground array memory according to a third embodiment of the invention.

Compared with the second embodiment, this embodiment is to form the word line structure 100 of the first embodiment in a virtual ground array memory 20 in FIG. 6. The same components will refer to the same numbers and the detailed descriptions thereof will be omitted. The method of forming the virtual ground array memory 20 includes the following steps.

Figure 7A:
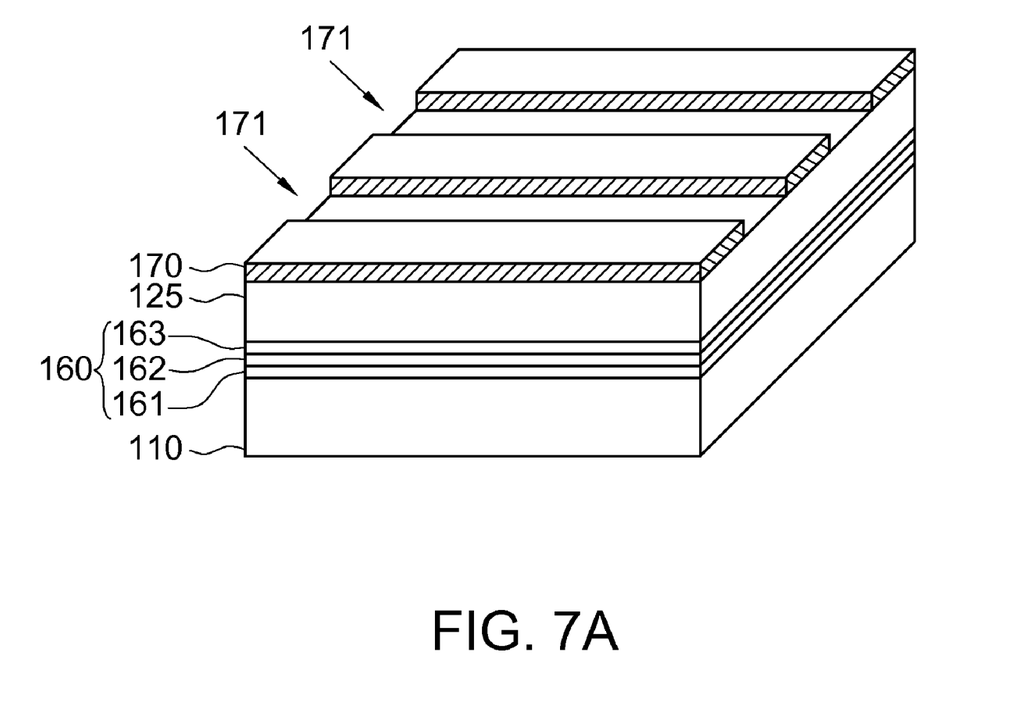
FIGS. 7A to 7G are schematic illustrations showing a method of forming the virtual ground array memory according to the third embodiment of the invention.

First, as shown in FIG. 7A, the dielectric layer 160, a conductive portion 125 and a mask layer 170 are sequentially formed on the substrate 110. The mask layer 170 has openings 171 for exposing a portion of the conductive portion 125. The mask layer 170 is composed of, for example, oxide or silicon nitride.

Figure 7B:
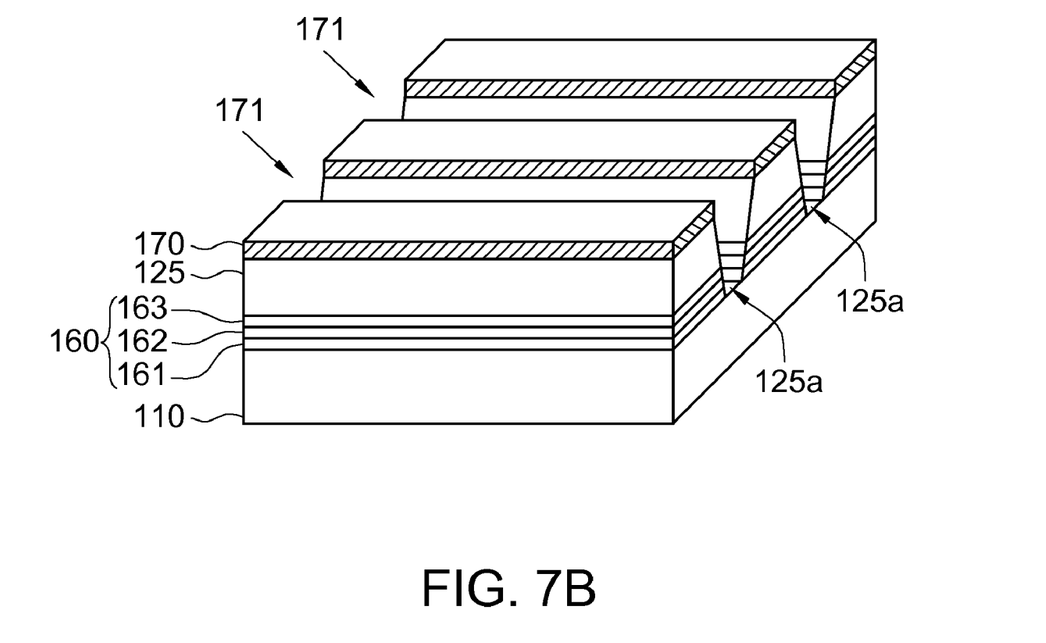

Next, an etching process is performed to form grooves 125a at the portion of the conductive portion 125, and a bottom surface of each groove 125a exposes the substrate 110, as shown in FIG. 7B.

Figure 7C:
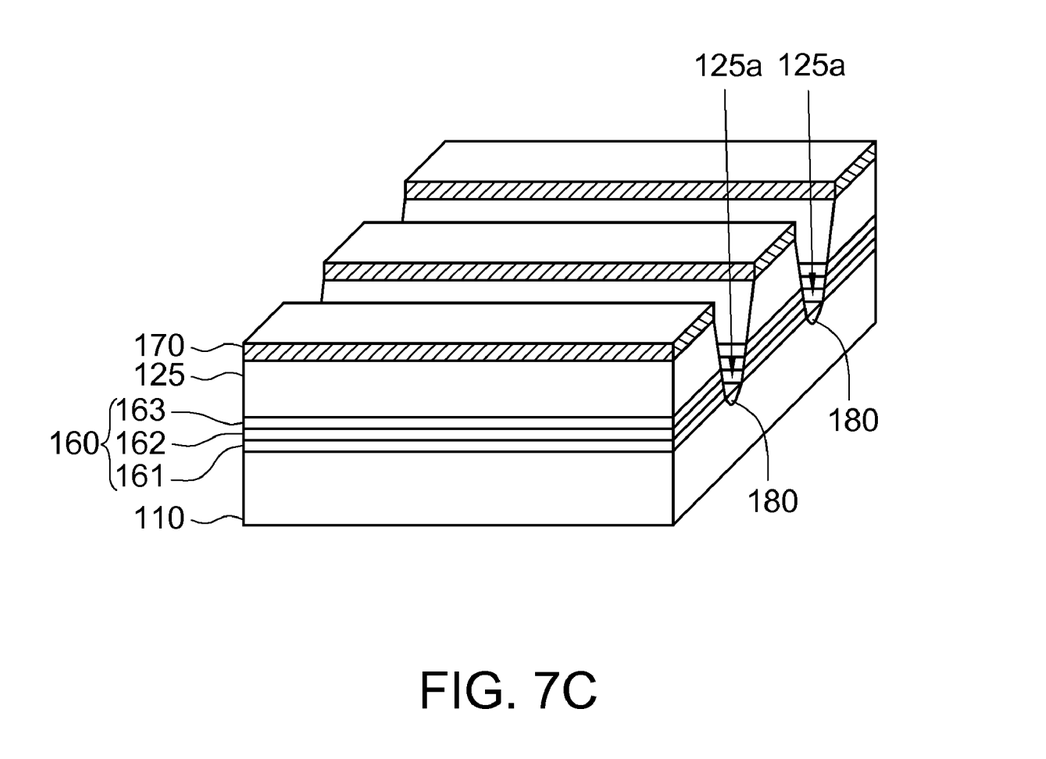

Then, a dopant is implanted into the exposed substrate 110 so that a doped region 180 is formed to serve as the drain/source region, as shown in FIG. 7C. The dopant may be, for example, a trivalent or quinquivalent metal ion.

Figure 7D:
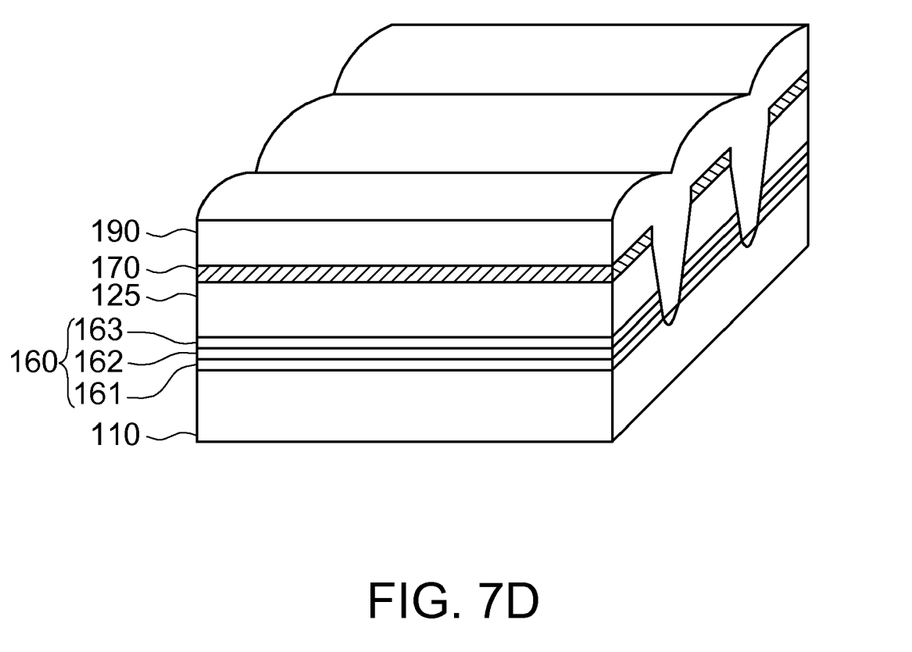

Next, a dielectric layer 190 is filled into each groove 125a by the high density plasma (HDP) technology, as shown in FIG. 7D. The dielectric layer 190 is composed of, for example, oxide.

Figure 7E:
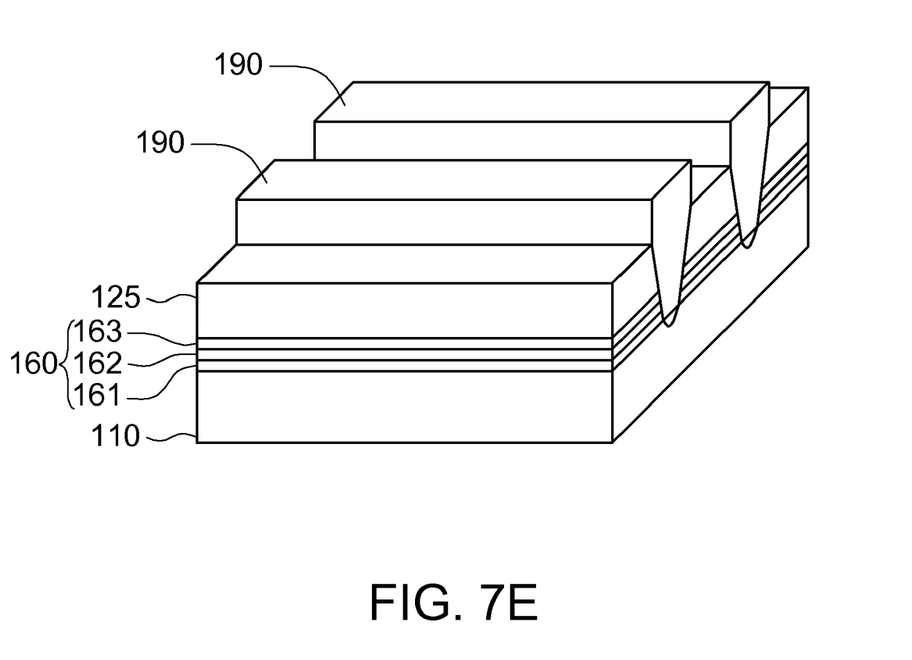

Then, the mask layer 170 and a portion of the dielectric layer 190 are removed to expose another portion of the conductive portion 125 and the remained dielectric layer 190, and the remained dielectric layer 190 is higher than the conductive portion 125, as shown in FIG. 7E.

Figure 7F:
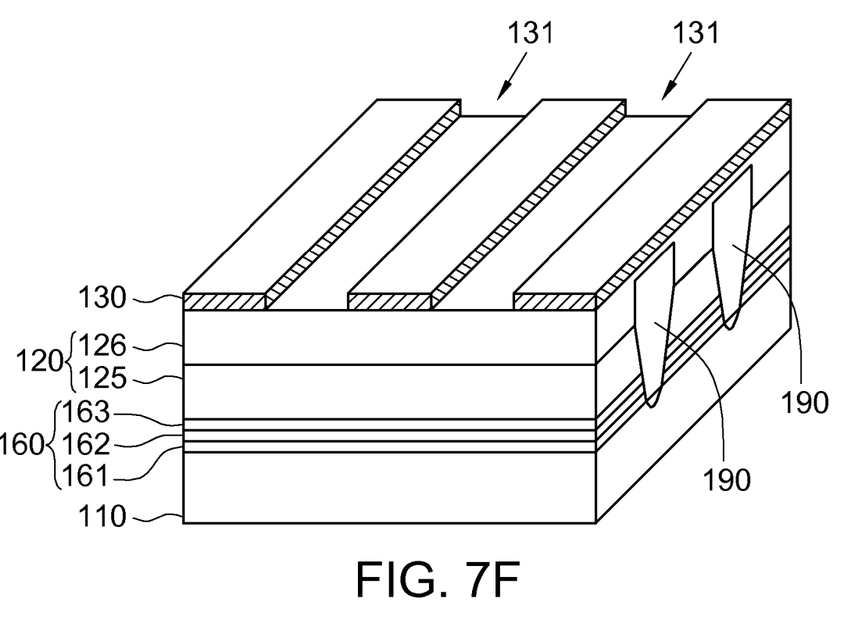

Next, as shown in FIG. 7F, a conductive portion 126 and the mask layer 130 are sequentially covered. An extending direction of each opening 131 of the mask layer 130 is substantially perpendicular to an extending direction of each opening 171 of the mask layer 170 in FIG. 7B. In addition, the conductive portion 125 and the conductive portion 126 constitute the conductive layer 120.

Figure 7G:
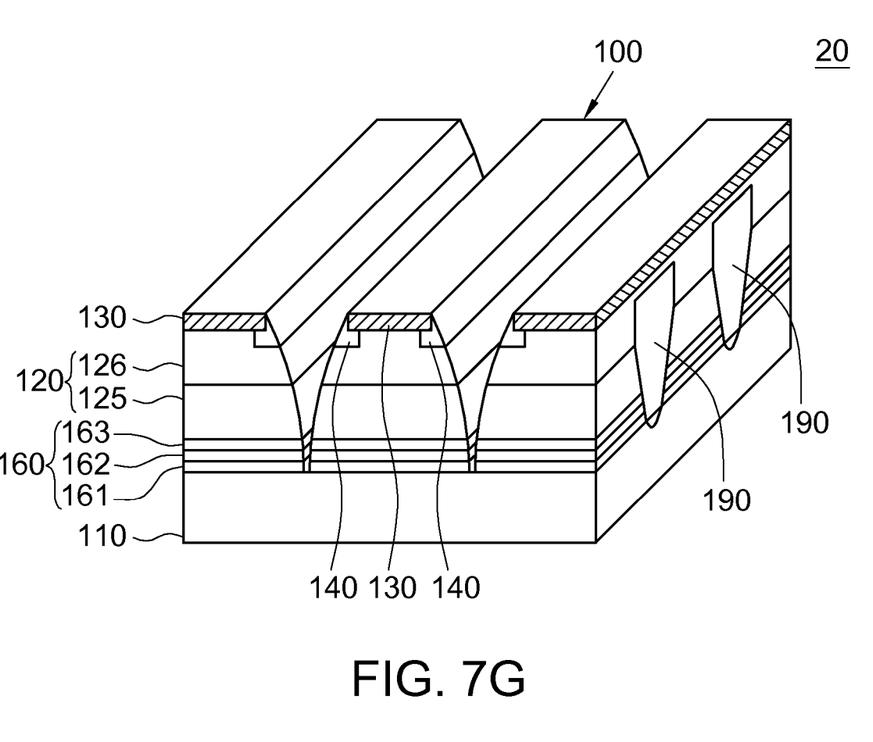

Then, the steps corresponding to FIGS. 2B to 2D are performed so that the virtual ground array memory 20 shown in FIG. 7G is formed. In this embodiment, the conductive portion 126 of the conductive layer 120 is etched to the height of the remained dielectric layer 190 in the step of forming the grooves 121 (see FIG. 2B). As shown in FIG. 7G, the width of the conductive structure of the virtual ground array memory 20 (i.e., the remained conductive layer 120 and the remained conformal layer 140) is greater than that of the conventional conductive structure, which only has a part of the middle portion 151 of the present embodiment. Thus, the speed of reading/writing the virtual ground array memory 20 may be correspondingly increased.

Figure 8:
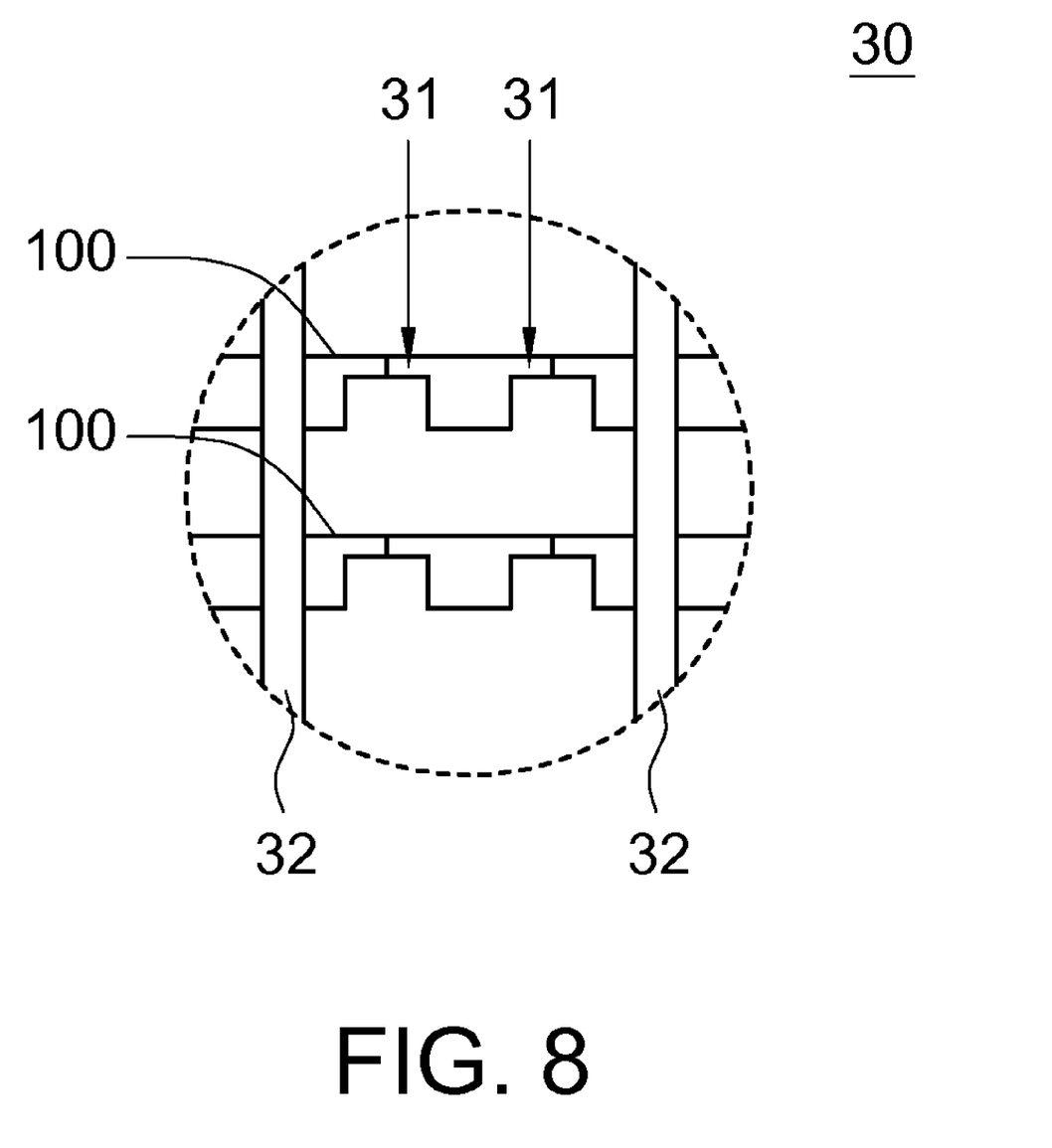
FIG. 8 is a schematic illustration showing an example of a PACAND array memory.

FIG. 8 is a schematic illustration showing an example of a PACAND array memory 30. In another embodiment, as shown in FIG. 8, every two left-right adjacent memory cells 31 serves as one unit and is disposed between two shallow trench isolation structures 32 in the PACAND array memory 30. The word line structure 100 of the first embodiment may also be applied to the PACAND array memory 30 so that the current of the memory cell 31 of the PACAND array memory 30 can be increased.

The gate structure of the semiconductor device and the methods of forming the word line structure and the memory according to the embodiments of the invention may be applied to the NAND array memory, the PACAND array memory or the virtual ground array memory. Thus, the width of the conductive structure having the two spacer portions increases so that the current of the memory cell may be increased to enhance the speed of reading/writing the memory. In addition, in the NAND array memory of the embodiment, the interval between the adjacent word line structures is reduced as a result of the disposition of the spacer portions. Thus, the inversion area is formed between the word line structures to serve as the source/drain region of the memory cell so that the doping step can be omitted, while the condition of the short channel effect can be effectively avoided.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A gate structure for a semiconductor device, the gate structure comprising:
    a conductive structure disposed over a substrate, the conductive structure comprising:
    a middle portion having a first surface and two second surfaces, wherein the first surface is between the two second surfaces; and
    two conductive spacer portions respectively connected to the two second surfaces of the middle portion, wherein a width of each of the two conductive spacer portions gradually increases from top to bottom, wherein an inner surface of each of the two conductive spacer portions contacts with the middle portion, and an outer surface of each of the two conductive spacer portions opposite the inner surface of each of the two conductive spacer portions is a curved surface; and
    a mask layer disposed on the middle portion of the conductive structure, wherein two sides of the mask layer are respectively enclosed by the two conductive spacer portions of the conductive structure so that the mask layer is embedded into the conductive structure.

2. The gate structure according to claim 1, wherein the semiconductor device comprises a dielectric layer disposed on the substrate, the conductive structure is disposed on the dielectric layer, and the dielectric layer comprises a charge trapping layer for storing charges.

3. The gate structure according to claim 2, wherein the dielectric layer further comprises at least one of a tunneling layer and a blocking layer, the tunneling layer is disposed between the substrate and the charge trapping layer, and the blocking layer is disposed between the charge trapping layer and the conductive structure.

4. A semiconductor device, comprising:
    a substrate;
    a dielectric layer formed on the substrate; and
    a plurality of gate structures, each of which comprises:
    a conductive structure disposed over the dielectric layer, wherein the conductive structure comprises a middle portion and two conductive spacer portions, the middle portion has a first surface and two second surfaces, wherein the first surface is between the two second surfaces, the two conductive spacer portions are respectively connected to the two second surfaces of the middle portion, and a width of each of the two conductive spacer portions gradually increases from top to bottom, wherein an inner surface of each of the two conductive spacer portions contacts with the middle portion, and an outer surface of each of the two conductive spacer portions opposite the inner surface of each of the two conductive spacer portions is a curved surface; and
    a mask layer disposed on the middle portion of the conductive structure, wherein two sides of the mask layer are respectively enclosed by the two conductive spacer portions of the conductive structure so that the mask layer is embedded into the conductive structure.

5. The semiconductor device according to claim 4, wherein the dielectric layer comprises a charge trapping layer for storing charges.

6. The semiconductor device according to claim 5, wherein the dielectric layer further comprises at least one of a tunneling layer and a blocking layer, the tunneling layer is disposed between the substrate and the charge trapping layer, and the blocking layer is disposed between the charge trapping layer and the conductive structure.

7. The semiconductor device according to claim 4, wherein when a voltage is applied to the gate structures, an inversion area is formed in the substrate between the two adjacent gate structures.

8. The semiconductor device according to claim 4, further comprising two doped regions respectively located in the substrate on two sides of each gate structure.

9. The semiconductor device according to claim 4 is a NAND array memory.

10. The semiconductor device according to claim 4 is a PACAND array memory.

11. The semiconductor device according to claim 4 is a virtual ground array memory.

12. The gate structure according to claim 1, wherein the mask layer comprises silicon oxide or silicon nitride.

13. A gate structure for a semiconductor device, the gate structure comprising:
    a conductive structure disposed over a substrate, the conductive structure comprising:
    a top conductive portion and a bottom conductive portion, wherein the top conductive portion is on the bottom conductive portion and the top conductive portion has a smaller width than the bottom conductive portion; and
    a conductive sidewall spacer on the bottom conductive portion, the top conductive portion having a sidewall contacting the conductive sidewall spacer; and
    a non-conductive layer disposed on the top conductive portion of the conductive structure, wherein a width of the non-conductive layer is greater than a width of the top conductive portion.

14. The gate structure according to claim 13, wherein the sidewall of the top conductive portion is a vertical sidewall and the bottom conductive portion has a curved sidewall.

15. The gate structure according to claim 13, wherein a top surface of the non-conductive layer and a top surface of the conductive sidewall spacer are in the same plane.

16. The gate structure according to claim 13, wherein the non-conductive layer comprises silicon oxide or silicon nitride.

17. The gate structure according to claim 13, wherein the semiconductor device comprises a dielectric layer disposed on the substrate, the conductive structure is disposed on the dielectric layer, and the dielectric layer comprises a charge trapping layer for storing charges.

* * * * *